United States Patent
Miao et al.

(10) Patent No.: US 8,189,802 B2
(45) Date of Patent: May 29, 2012

(54) DIGITAL FILTERING IN A CLASS D AMPLIFIER SYSTEM TO REDUCE NOISE FOLD OVER

(75) Inventors: Guoqing Miao, San Diego, CA (US); Matt Sienko, San Diego, CA (US); Seyfollah Bazarjani, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 703 days.

(21) Appl. No.: 12/407,238

(22) Filed: Mar. 19, 2009

(65) Prior Publication Data

US 2010/0239102 A1   Sep. 23, 2010

(51) Int. Cl.
*H04R 3/02* (2006.01)
(52) U.S. Cl. .......... 381/73.1; 381/98; 381/108; 381/120
(58) Field of Classification Search ............. 381/73.1, 381/98, 108, 119, 120; 330/10, 251
See application file for complete search history.

(56) References Cited

U.S. PATENT DOCUMENTS

| | | | |
|---|---|---|---|
| 7,385,443 B1 * | 6/2008 | Denison | 330/9 |
| 7,453,316 B2 * | 11/2008 | Shimizu | 330/10 |
| 7,623,053 B2 * | 11/2009 | Terry et al. | 341/143 |
| 7,679,435 B2 * | 3/2010 | Tsuji et al. | 330/10 |
| 2004/0141558 A1 | 7/2004 | Plisch et al. | |
| 2006/0092063 A1 | 5/2006 | Ido et al. | |

OTHER PUBLICATIONS

International Search Report and Written Opinion—PCT/US2010/027876, International Search Authority—European Patent Office—Jun. 25, 2010.
Eric Gaalaas: "Class D Audio Amplifiers: What, Why, and How", Analog Dialogue, Analog Devices, vol. 40, No. 2, pp. 1-7, Jun. 2006.
David K. Su: "A CMOS Oversampling D/A Converter with a Current-Mode Semidigital Reconstruction Filter", IEEE Journal of Solid State Circuits, vol. 28, No. 2, pp. 1224-1233, Dec. 1993.
Toru Ido, et al.: "A Digital Input Controller for Audio Class-D Amplifiers with 100W 0.004% THD+N and 113dB DR", ISSCC 2006, Session 19, Analog Techniques, 19.3, pp. 1-10, Feb. 7, 2006.

* cited by examiner

*Primary Examiner* — Kevin M Picardat
(74) *Attorney, Agent, or Firm* — Eric Ho

(57) ABSTRACT

An improved power amplifier system is provided. The power amplifier system includes a programmable digital filter and a power amplifier, each responsive to a plurality of frequency response settings and switching frequency settings, respectively. Each frequency response setting and switching frequency setting is adaptively selected by a processor device to match a bandwidth of an incoming audio signal. The processor device identifies the current bandwidth of an incoming audio signal and adaptively selects a switching rate setting and a frequency response setting based on the current bandwidth. The frequency response setting is selected so as to reduce noise fold over in the power amplifier for a corresponding bandwidth, sampling rate setting, and switching frequency setting.

23 Claims, 9 Drawing Sheets

| Mode | Audio Bandwidth (Hz) (DSM Sampling Rate (Hz)) | FIR | PA Switching Frequency (Hz) |
|---|---|---|---|
| 1 | 8K (2.048M) | FIR1 | 1.024M |
| 2 | 11.025K (2.8224M) | FIR1 | 1.411M |
| 3 | 12K (3.072M) | FIR1 | 1.536M |
| 4 | 16K (4.096M) | FIR2 | 1.024M |
| 5 | 22.05K (5.6448M) | FIR2 | 1.411M |
| 6 | 24K (6.144M) | FIR2 | 1.536M |
| 7 | 32K (8.196M) | FIR3 | 1.024M |
| 7 | 32K (8.196M) | FIR4 | 683K |
| 8 | 44.1K (11.896M) | FIR3 | 1.411M |
| 8 | 44.1K (11.896M) | FIR4 | 991.3K |
| 9 | 48K (12.288M) | FIR3 | 1.536M |
| 9 | 48K (12.288M) | FIR4 | 1.024M |

FIG. 9

DIGITAL FILTERING IN A CLASS D AMPLIFIER SYSTEM TO REDUCE NOISE FOLD OVER

TECHNICAL FIELD

The present disclosure relates generally to an electronic device, and more specifically to an audio amplification system implemented in an integrated circuit.

BACKGROUND

Portable electronic devices are widely deployed to provide various capabilities such as viewing and hearing of video, music, voice, and other multimedia. In order to hear the audio portion of these capabilities, an audio amplifier is used to drive a speaker to produce sounds. Additionally, the audio source signal types can be of varying quality and bandwidth. Accommodating the myriad of source signal types can increase the complexity of an audio amplifier design.

There is a continual growth of users of portable devices which have the ability to play audio in its various forms while keeping device size to a minimum. To minimize the size of a device, manufacturers typically incorporate increasing functionality into an application specific integrated circuit (ASIC) instead of discrete components. In order to amplify an audio signal so that it can drive an external speaker, the power amplifier must be able to increase the power of the source signal.

As it is known in the art, power amplifiers translate a source signal into an amplified electrical output signal and heat. The ratio of energy used for amplified electrical output to heat dissipation is known in the art as thermal efficiency. Small size ASICs, due to their small packaging, do not have the ability to sink a great deal of heat. Therefore, ASICs which incorporate high thermally efficient designs in small packaging while being low cost and low complexity are desired. One such amplifier class is known in the art as the Class D amplifier.

The advantages of Class D amplifiers over other type of amplifier configurations are well known. The reference titled "Class D Audio Amplifiers: What, Why, and How", by Eric Gaalaas, in Analog Dialogue, published by Analog Devices, Vol. 40, No. 2, pp. 1-7, is incorporated herein by reference. As explained, it is desirable for power amplifier systems to accommodate source signals, typically audio signals, of various bandwidths and to do so in a manner that eliminates or reduces noise from different sources.

SUMMARY

An improved power amplifier system is provided. The power amplifier system includes a programmable digital filter and a power amplifier, each responsive to a plurality of frequency response settings and switching frequency settings, respectively. Each frequency response setting and switching frequency setting is adaptively selected by a processor device to match a bandwidth of an incoming audio signal. The processor device identifies the current bandwidth of an incoming audio signal and adaptively selects a switching rate setting and a frequency response setting based on the current bandwidth. The frequency response setting is selected so as to reduce noise fold over in the power amplifier for a corresponding bandwidth, sampling rate setting, and switching frequency setting.

Various other aspects and embodiments of the disclosure are described in further detail below.

The summary is neither intended nor should it be construed as being representative of the full extent and scope of the present disclosure, which these and additional aspects will become more readily apparent from the detailed description, particularly when taken together with the appended drawings.

BRIEF DESCRIPTION OF THE DRAWINGS

FIG. 9 is a table showing switching frequency, $F_c$, selection based upon the combination of audio bandwidth, DSM sampling rate, and FIR filter response.

Figure 1:
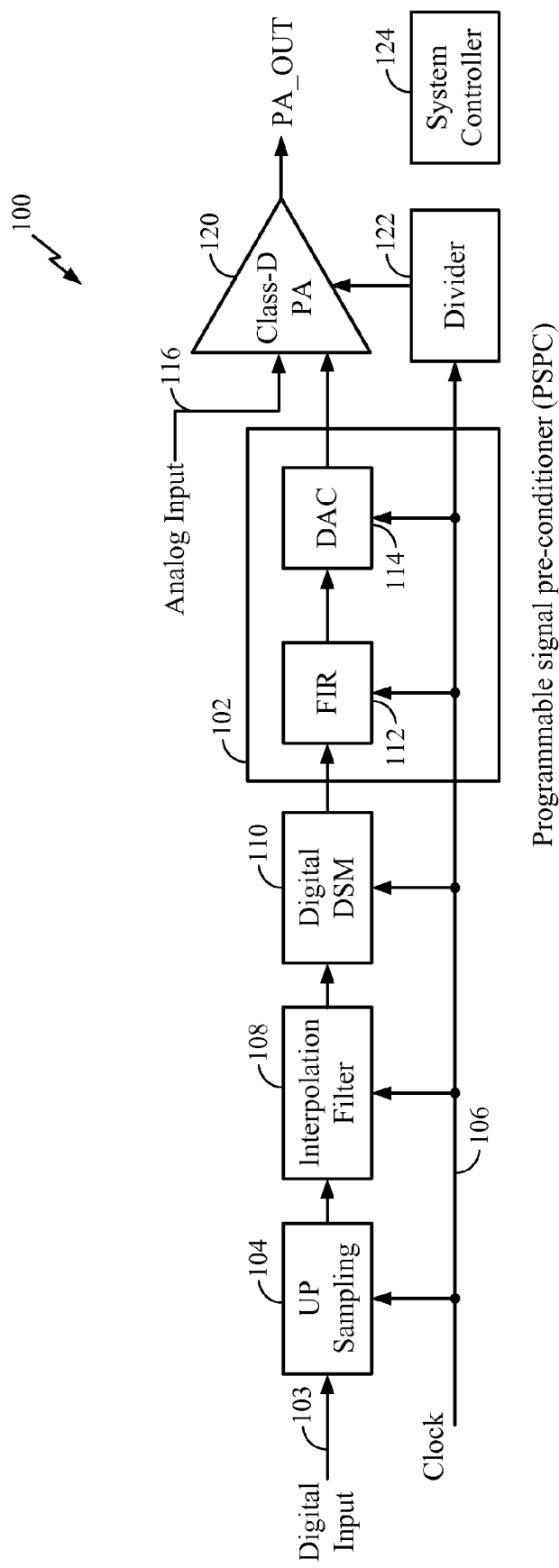
FIG. 1 is a block diagram of a complete system amplifier chain in accordance with a preferred embodiment.

To facilitate understanding, identical reference numerals have been used, where possible to designate identical elements that are common to the figures, except that suffixes may be added, when appropriate, to differentiate such elements. The images in the drawings are simplified for illustrative purposes and are not necessarily depicted to scale.

The appended drawings illustrate exemplary configurations of the disclosure and, as such, should not be considered as limiting the scope of the disclosure that may admit to other equally effective configurations. Correspondingly, it has been contemplated that features of some configurations may be beneficially incorporated in other configurations without further recitation.

DETAILED DESCRIPTION

The programmable signal pre-conditioner (PSPC) described herein may be used in various portable and non-portable electronic devices that require the use of a power amplifier to drive an audio speaker. The source signal to be amplified may either be a digital or analog signal of a plurality of input sources and a plurality of bandwidth and sampling rates. The programmable signal pre-conditioner preferred embodiment is to be used with a Class D power amplifier. As known in the art, the PSPC may be used with other power amplifier classes as well. The terms "amplifier chain" and "amplifier lineup" are used interchangeably and refer to all the components from the input source to the speaker. The amplifier configuration may be single-ended or use differential signals throughout the amplifier chain.

FIG. 1 is a block diagram of a complete system amplifier chain 100 in accordance with the present embodiment as shown. System amplifier chain 100 includes a typical up sampling block 104, used to raise the sampling rate of a low rate digital input 103. The higher rate, up-sampled output is passed to interpolation filter 108 which filters out baseband spectral copies in the digital domain. Interpolation filter 108 is connected to digital delta-sigma modulator 110 which generates a digital input to a programmable signal pre-conditioner (PSPC) 102. Power amplifier 120 amplifies a conditioned analog representation of the digital input from the PSPC 102 to drive a resistive load such as a speaker. The input to power amplifier 120 may also be a conventional, non-conditioned analog signal, represented by analog input 116.

Power amplifier 120, in the preferred embodiment shown, is a Class D amplifier. Class D amplifiers are typically non-linear and employ pulse width modulation (PWM), in a known manner. A system clock 106 provides unified timing to the entire system amplifier chain 100. Clock divider 122 divides the clock signal from system clock 106 to provide power amplifier 120 with a synchronous timing reference.

Prior art implementations of signal pre-conditioner blocks are typically fixed, non-programmable high order analog filtering designs configured to eliminate high frequency signal components. Because high frequency signal components entering power amplifier 120 can cause a fold over of noise onto an audio signal thus causing distortion, conventional techniques aim to reduce the fold over noise further by including additional stages of analog filtering.

The additional stages add a high degree of circuit complexity in the design, increase per unit cost in an ASIC implemented system amplifier chain, and result in die area penalty and increased power consumption.

In the preferred embodiment, programmable signal pre-conditioner 102 includes programmable digital filter 112, which is a finite impulse response (FIR) filter (as shown) but may also be substituted by an infinite impulse response filter (IIR), or an equivalent thereto.

In the illustrative embodiment, programmable digital filter 112 is programmable and configured to generate a digital value representative of a FIR frequency response. The FIR frequency response of the digital value is selectably variable and characterized by one or more poles and zeroes depending on source audio bandwidth, selected sample rate, and selected carrier signal frequency, as shall be described in greater detail below. Programmability may be via internal or external system controller 124.

The digital value output from programmable digital filter 112 feeds digital-to-analog converter (DAC) 114. DAC 114 is used to convert the digital value to an analog signal, this signal being the conditioned analog representation of the digital input into PSPC 102 which is passed through to power amplifier 120.

FIR 112 and DAC 114 may be implemented as a combination or as two separate blocks. In an a further aspect, DAC 114 may include an additional low pass filter to decrease distortion of the conditioned analog representation of the digital input before it is fed into power amplifier 120. In another aspect, power amplifier 120 may be selectably programmed to drive analog input 116, which could be a default operation (a primary input), when the output from PSPC is otherwise not enabled, as further described below.

Figure 2:
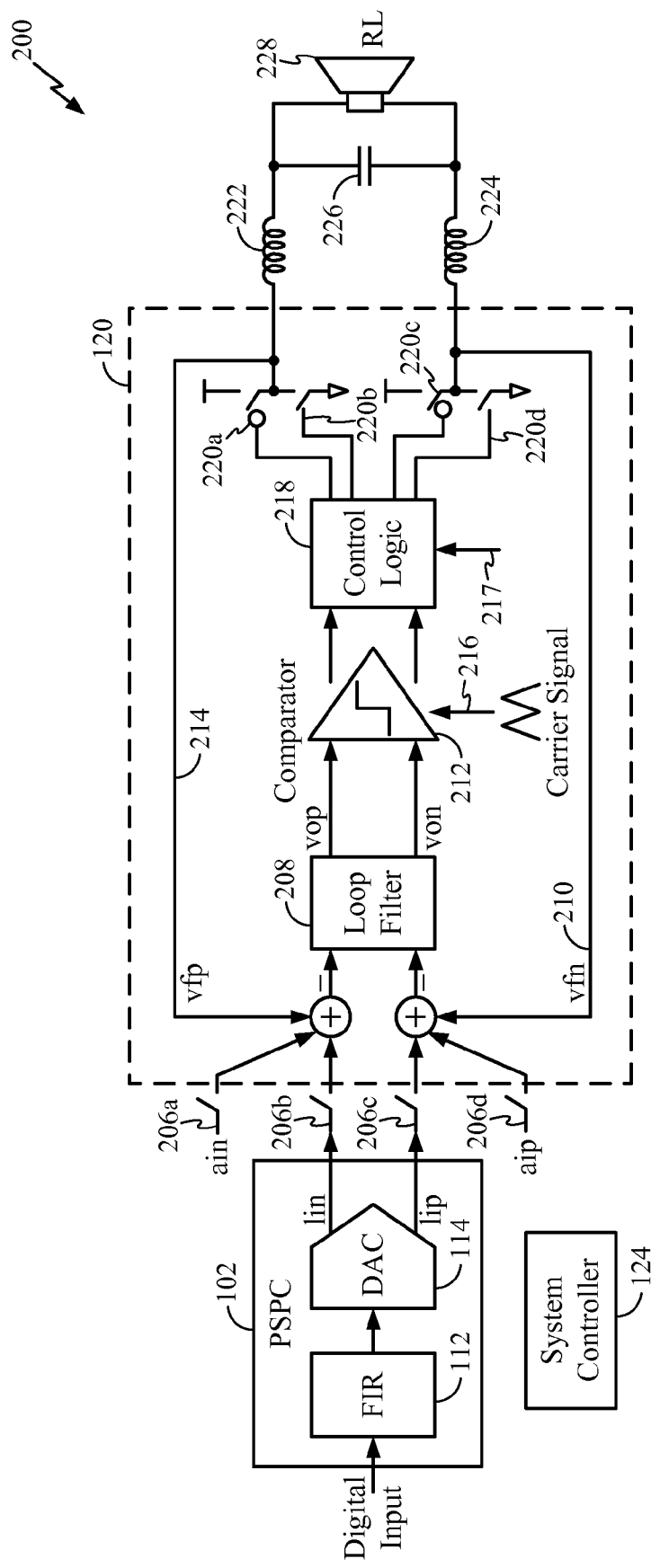
FIG. 2 shows a sub-section of the amplifier chain of FIG. 1 in accordance with a first preferred embodiment implemented in a differential ended voltage configuration.

FIG. 2 shows a sub-section of the amplifier chain 100 of FIG. 1 in accordance with a first preferred embodiment implemented in a differential ended voltage configuration. DAC 114 converts the filtered digital signal from programmable digital filter 112 and drives differential signals, $l_{in}$ and $l_{ip}$, into switches 206b and 206c. Switches 206a and 206d are also provided to the input of the power amplifier 120 to select input signals from a multitude of alternate analog audio sources. In the example embodiment, power amplifier block 120 is a class D amplifier which includes loop filter 208. The input to loop filter 208 are switches 206a, 206b, 206c and feedback signals vfn 210 and vfp 214.

Typical configurations of loop filter 208 are integrator circuits used as a control loop to minimize amplifier distortion. Comparator 212 is fed by loop filter 208 outputs vop and von. The differential analog output of comparator 212 feeds control logic 218. Control logic 218 passes the output of comparator 212 through to switches 220a, 220b, 220c, and 220d. System controller 124 generates control logic signal control 217. Control logic 218 may be realized in a multitude of PMOS and NMOS integrated circuits. Feedback signals vfn 210 and vfp 214 are connected to the output of switches 220a, 220b, 220c, and 220d. In the example embodiment depicted in FIG. 2, comparator 212 implements a PWM function by comparing the signal input to 212 with that of the carrier signal 216.

The output of comparator 212 is typically a signal that can be amplified with greater thermal efficiency as compared to traditional linear amplifiers. The differential output of the power amplifier 120 is routed through inductors 222 and 224 in series with capacitor 226 in parallel to form a typical low pass filter which directly drives the speaker 228.

Figure 3:
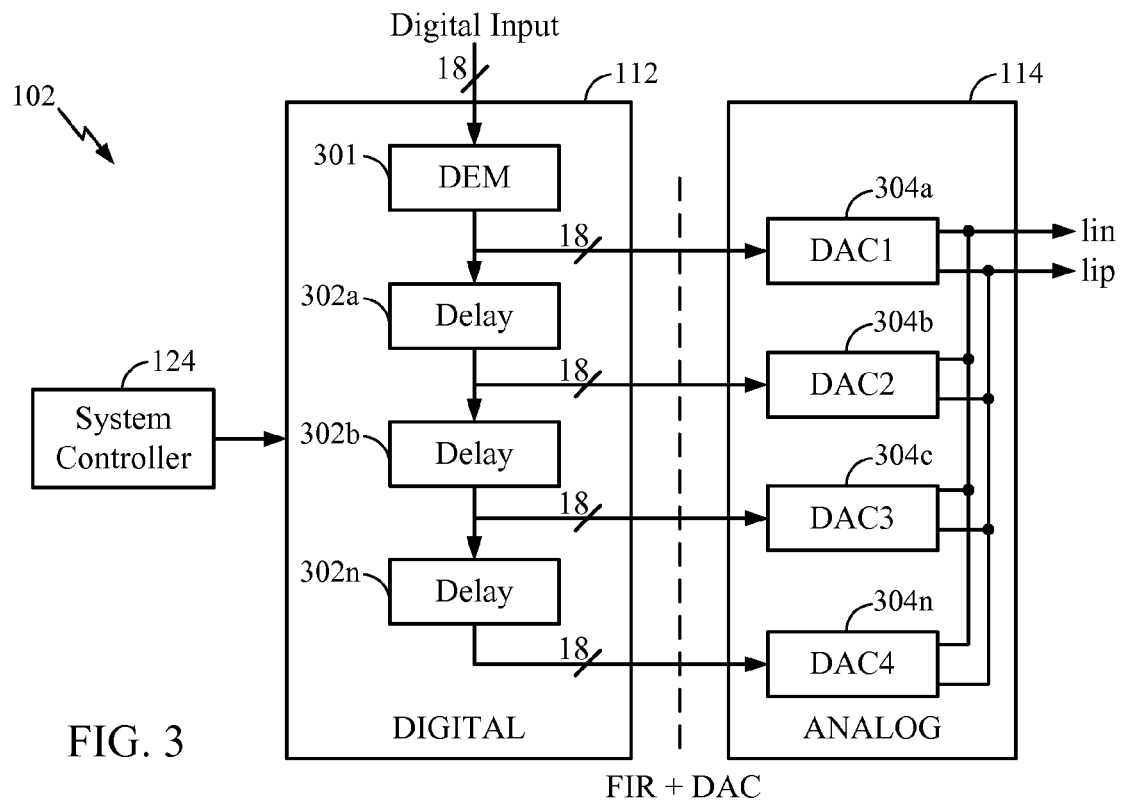
FIG. 3 is an illustrative embodiment of the programmable signal pre-conditioner of FIGS. 1 and 2.

FIG. 3 is an illustrative embodiment of the programmable signal pre-conditioner of FIGS. 1 and 2. The output of DSM 110 is fed into programmable digital filter 112 which filters the digital input in accordance with system controller 124. Digital filter 112 includes dynamic element matching (DEM) 301 and the output of DEM 301 feeds the first of a series of delay lines 302a, 302b, 302c, . . . 302n. DEM 301 also feeds the first of a series of DAC 114 sub elements 304a, 304b, 304c, . . . 304n.

Digital filter 112 and DAC 114 may be interconnected into one module to simplify an integrated circuit design.

The configuration in FIG. 3 allows the design to implement dynamic element matching (DEM) 301 thus minimizing or eliminating linearity mismatch and total harmonic distortion. The number of delay lines in programmable digital filter 112 may be variable. Additionally, the number of bits-per-sample interconnecting individual delay elements 302a . . . 302n may be variable. The illustrative embodiment uses an 18 bit per sample structure for digital to analog converter sub elements 304a . . . 304n. One skilled in the art would recognize that there may be a variable number of bits of resolution between interconnects.

Figure 4:
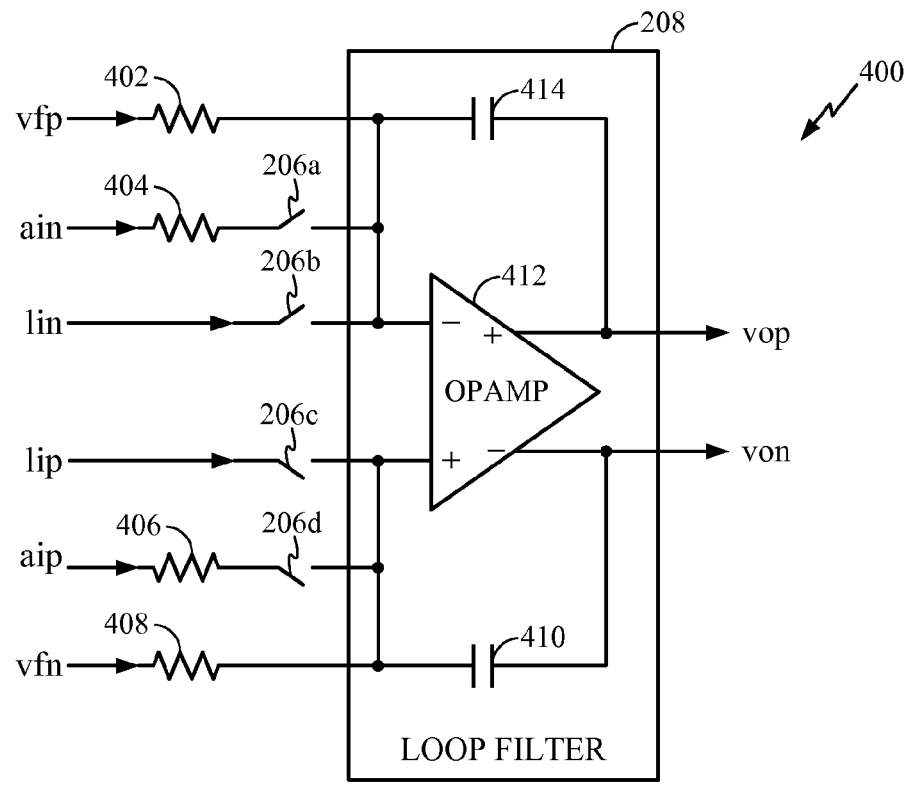
FIG. 4 is an illustrative embodiment of the loop filter of FIG. 2 shown with external toggling switches.

FIG. 4 is an illustrative embodiment of the loop filter of FIG. 2 shown with external toggling switches. Loop filter 208 includes operational amplifier (opamp) 412 configured as an inverting amplifier. The output of opamp 412 is directly connected to comparator 212. The negative input of opamp 412 includes is simultaneously connected to the output of switch 206b, the output of switch 206a, the output of resistor 402 and one end of capacitor 414. The other end of capacitor 414 is connected to the positive output of opamp 414. The input of resistor 402 is feedback signal vfp. The input of resistor 404 is the alternate analog input ain. The output of resistor 404 feeds switch 206a. The input of switch 206b is lin, the conditioned output of PSPC 102. The positive input of opamp 412 is simultaneously connected to the output of switch 206c, switch 206d, the output of resistor 408 and one end of capacitor 410. The other end of capacitor 410 is connected to the negative output of opamp 412.

The input to switch 206c is the output of PSPC 102, lip. Switch 206d is fed by resistor 406. Resistor 406 is the alternate analog non-conditioned input signal aip. Loop filter 208 is configured to implement a closed loop control system. The example embodiment of loop filter 208 in FIG. 4 is an integrator filter. Typically, loop filter 208 can be implemented through any combination of proportional, derivative, or integrator control functions.

Figure 5:
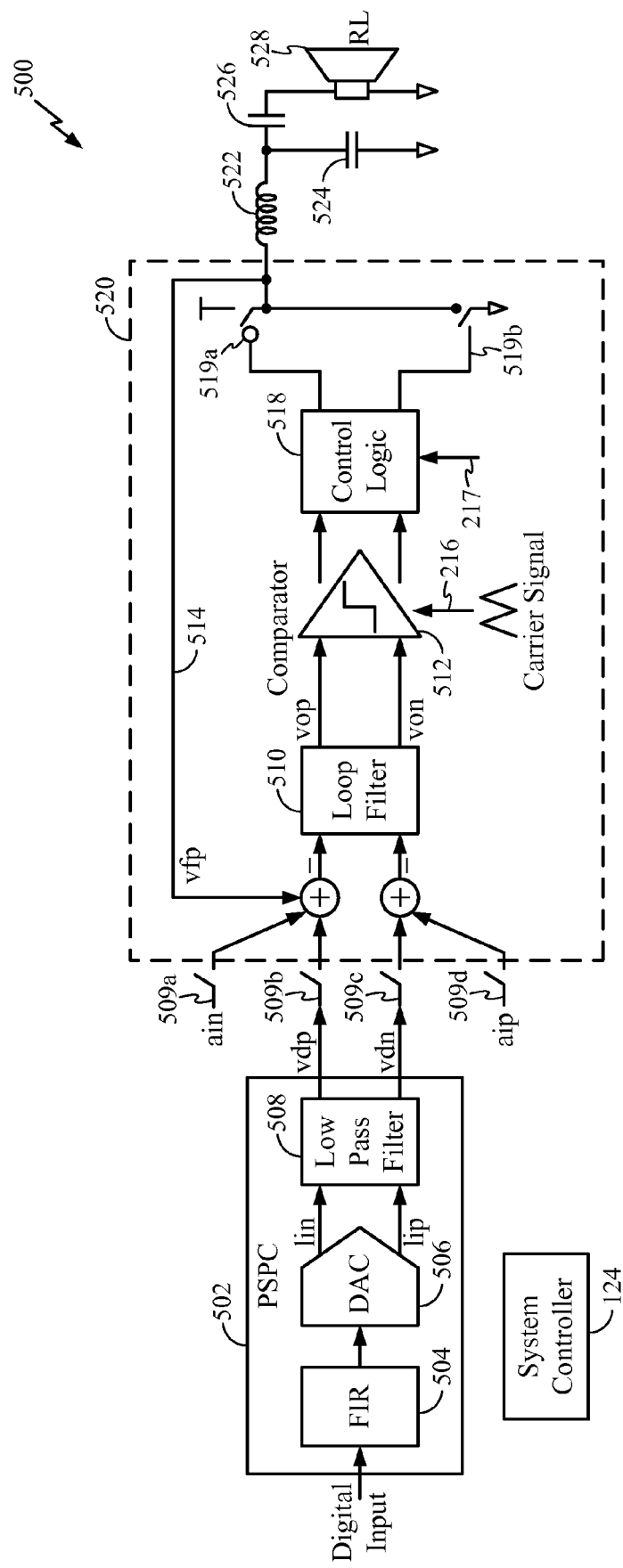
FIG. 5 shows a second preferred embodiment in a single-ended voltage configuration.

FIG. 5 shows a second preferred embodiment in a single-ended voltage configuration. PSPC 502 includes programmable digital filter 504, DAC 506, and low pass filter 508. Digital filter 504 and DAC 506, in the preferred embodiment, operate and interconnect in an identical manner to programmable digital filter 112 and DAC 114. Low pass filter 508 receives is the differential analog output of DAC 506, $l_{in}$ and $l_{ip}$. The output of low pass filter 508 feeds switches 509b and 509c. Low pass filter 508 is added to this single-ended embodiment to provide signal buffering and limit distortion that could be caused in the single-ended configuration if the output of DAC 506 were directly connected to switches 509b and 509c. Power amplifier 520 includes loop filter 510, comparator 512, control logic 518 and switches 519.

In the present embodiment, loop filter 510 operates and interconnects in an identical manner to loop filter 208, and comparator 512 operates and interconnects in an identical manner to comparator 212. Carrier signal 216 and logic control 217 operate and interconnect identically as in the differential output embodiment of FIG. 2. Control logic block 518 is fed by the output of comparator 518. The output of control logic 518 is a pass through signal from comparator to switches 519a and 519b in accordance with the system controller 124. The output of switches 519a and 519b connect together and feed inductor 522. The output of inductor 522 is connected capacitor 524 and capacitor 526 forming a typical low pass filter, which drives speaker 528.

Figure 6:
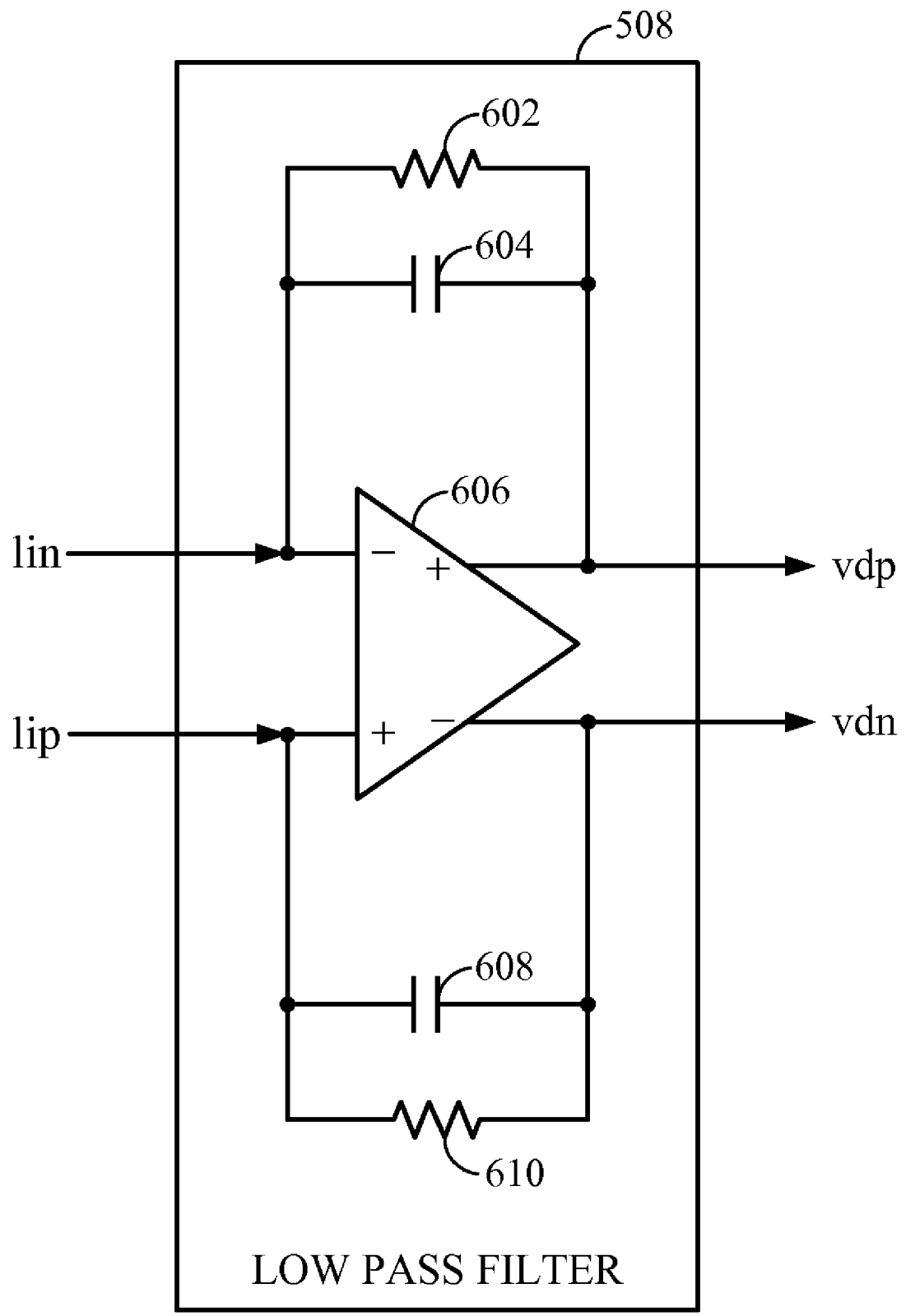
FIG. 6 is an example embodiment of the low pass filter shown in FIG. 5.

FIG. 6 is an example embodiment of the low pass filter shown in FIG. 5. Low pass filter 508 is fed with the conditioned analog representation of the digital input into PSPC 102, lin and lip. The output of low pass filter 508 connects to the input of power amplifier 520. Feedback resistor 602 and feedback capacitor 604 are connected in parallel to the positive output and negative input of operational amplifier 606. Capacitor 608 and resistor 610 are connected in parallel between the positive input and negative output of operational amplifier 606.

The reference titled, "A CMOS Oversampling D/A Converter with a Current-Mode Semidigital Reconstruction Filter", by David K. SU, IEEE Journal Of Solid State Circuits, Vol. 28, No. 12, December 1993, pp. 1224-1233, incorporated herein by reference, depicts use of an FIR digital filter with DAC and low pass filter to increase sampling rate and shape quantization noise of a digitally encoded audio signal.

Class D power amplifiers benefit from higher thermal efficiency as compared to other amplifier classes known in the art. The main component of a Class D amplifier that enables this thermal efficiency is comparator 212 and comparator 512 configured to implement a pulse width modulation (PWM) function. The PWM function, known in the art, is inherently non-linear and creates intermodulation distortion signal components that are related to the switching frequency of the comparators.

The example embodiment output of comparator 212 can be expressed as $$y(t) = \qquad \text{Eq (1)}$$
$$M\sin(\omega_M t) + \sum_{i=1}^{\infty} \frac{2V_0}{i\pi} \sum_{1=-\infty}^{\infty} \frac{1-(-1)^{i+1}}{2} B(i, 1)\cos\left(\omega(i, 1)t + i\frac{\pi}{2}\right),$$

where $\omega(i, 1) = i\omega_C + 1\omega_M,$ \qquad Eq (2)

$$B(i, 1) = \sum_{p=-\infty}^{\infty} J_p(i\beta)J_{1-2p}(i\beta_M), \qquad \text{Eq (3)}$$

and $\omega_C$ is the switching frequency of comparator 212 in radians, $\omega_M$ is the input source frequency in radians, and $J_n(x)$ is the Bessel function of the first kind with order n and argument x.

Equations (1), (2), and (3) generally describe the nonlinear behavior of comparator 212 and comparator 512 when the input source frequency is many times less than the switching frequency of comparator 212 or comparator 512. Nonlinearities and noise are also present when the input source frequency content is closer or even greater in frequency than the switching frequency of the comparator. Specifically, if there is spectral content at integer multiples of the switching frequency of comparator 212 or comparator 512, the nonlinearities become folded over in the digital domain into the input source frequency content representation and cause distortion of the primary output signal of amplifier 120.

Figure 7:
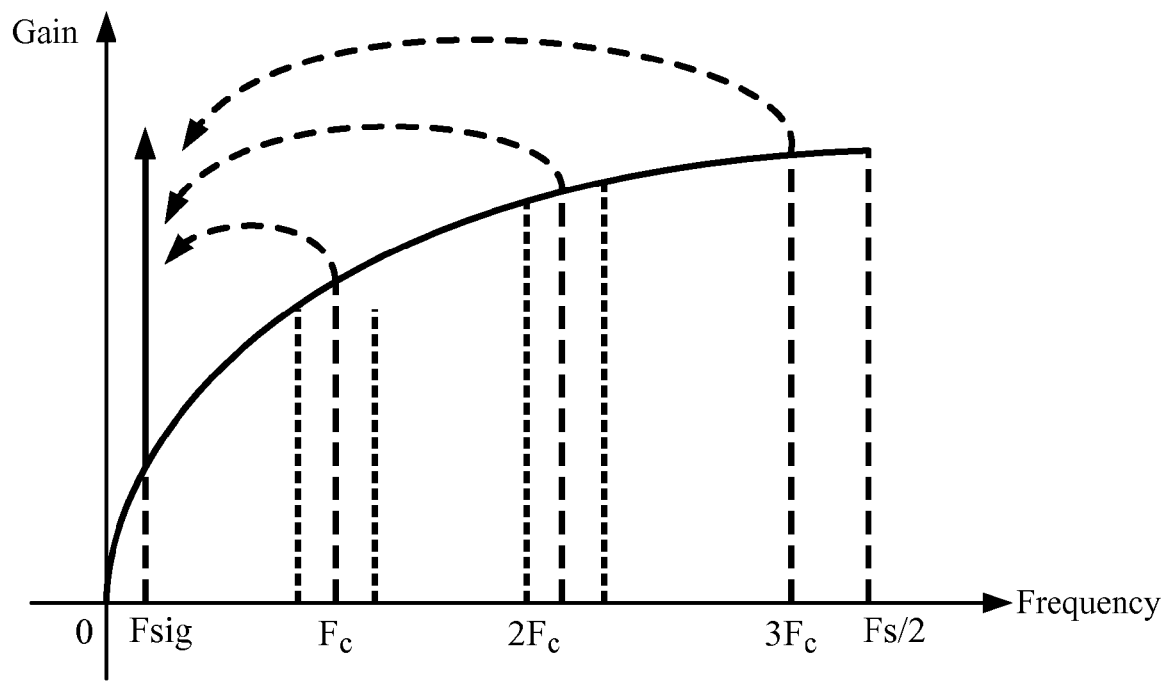
FIG. 7 is a graphical illustration of frequency response of a non-conditioned digital input, Fsig, for a conventional amplifier chain, showing noise folding at integer multiples of a corresponding switching frequency, Fc.

FIG. 7 is a graphical illustration of frequency response of a non-conditioned digital input, Fsig, for a conventional amplifier chain, showing noise folding at integer multiples of a corresponding switching frequency, Fc. Digital filter 112 or 504 may be designed to have zeroes in the frequency response corresponding to integer multiples of the switching frequency of comparator 212 to minimize the fold over of the nonlinearities and noise.

Figure 8:
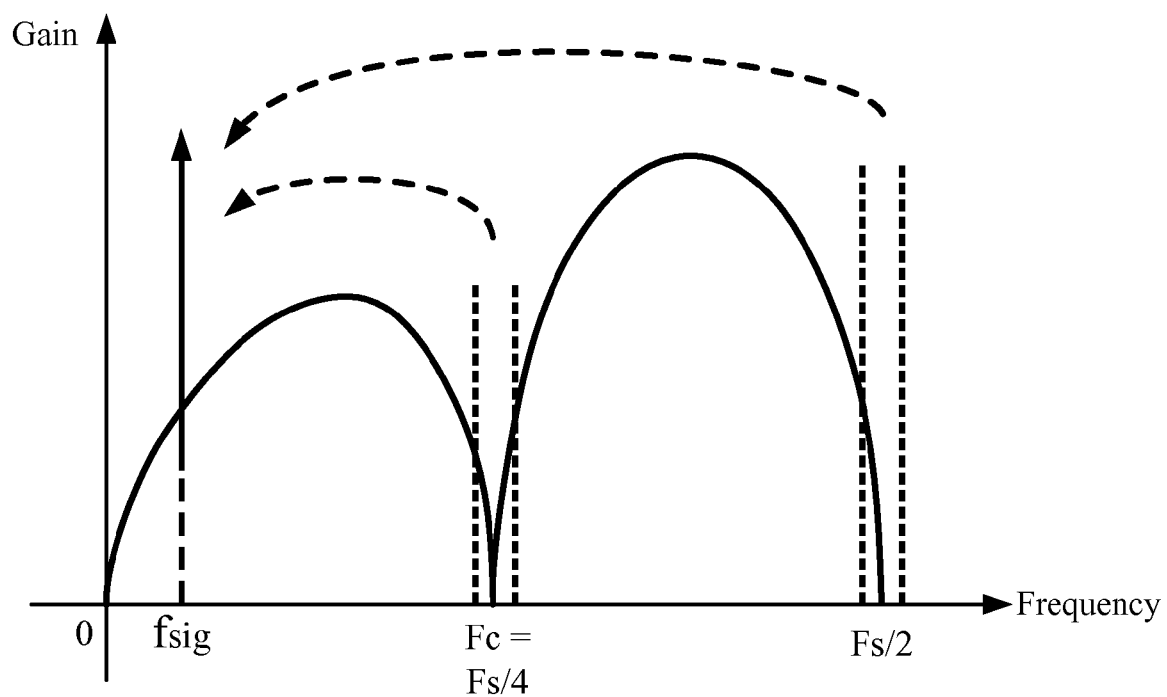
FIG. 8 is a graphical illustration of frequency response of a conditioned digitally filtered input, Fsig, in accordance with the preferred embodiments, showing significant reduction of noise folding at integer multiples of Fc.

FIG. 8 is a graphical illustration of frequency response of a conditioned digitally filtered input, Fsig, in accordance with the preferred embodiments, showing significant reduction of noise folding at integer multiples of Fc. Design of the programmable digital filter 112 (or programmable digital filter 504) may be then selectively variable and characterized by digital DSM 110 sampling rate, the input source signal frequency bandwidth, and the switching frequency. Since the programmability of a programmable digital filter is done very simply in the art, the complete programmable signal preconditioner 102 (or 502) implementation may be realized on an ASIC while minimizing die size and heat dissipation.

FIG. 9 is a table showing switching frequency, $F_c$, selection based upon the combination of audio bandwidth, DSM sampling rate, and FIR filter response. In the preferred embodiment there are 9 combinations of DSM sampling rates corresponding to different potential audio bandwidths of audio signals commonly used in present day portable electronic devices. FIG. 9 is a table of the preferred combinations of audio bandwidth, digital delta sigma modulation (DSM) sampling rates, switching frequencies, and programmable digital filter frequency responses. The programmable digital filter 112 or 504 is implemented with 4 types of frequency responses, labeled FIR1, FIR2, FIR3, FIR4, respectively. The switching frequency, $F_c$, is then selected based upon the combination of audio bandwidth, DSM sampling rate, and FIR filter response.

Other combinations appropriate programmable digital filter 112 or 504 coefficients can be designed as is known in the art. Because the coefficients that implement the programmable digital filters can be stored internally or externally, programmable control of the mode of operation, with mode=1, 2, 3, . . . , 8, 9, as depicted in FIG. 9, can be implemented internally or externally with system controller 124.

Figure 10:
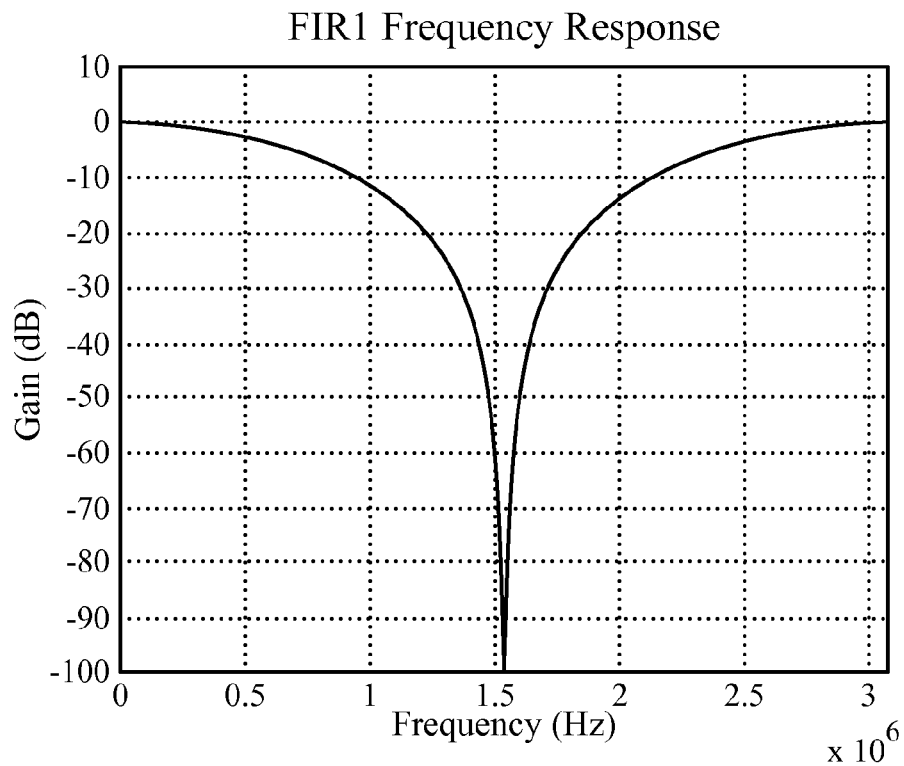
FIG. 10 is the FIR filter response of a FIR1 type programmable digital filter.

FIG. 10 is the FIR filter response of a FIR1 type programmable digital filter.

Figure 11:
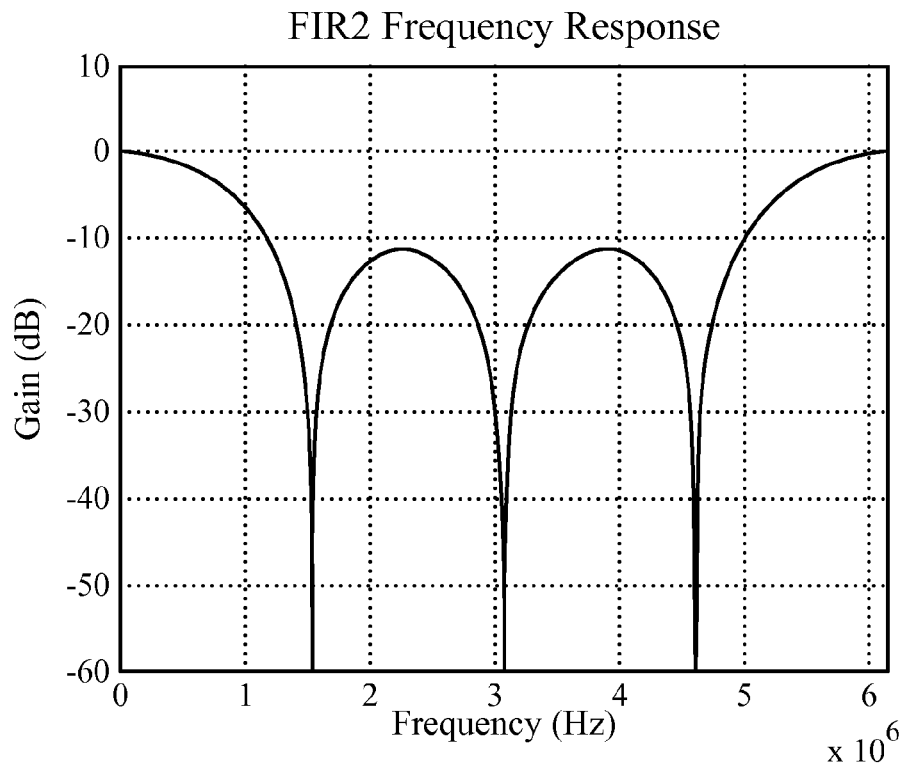
FIG. 11 is the FIR filter response of a FIR2 type programmable digital filter.

FIG. 11 is the FIR filter response of a FIR2 type programmable digital filter.

Figure 12:
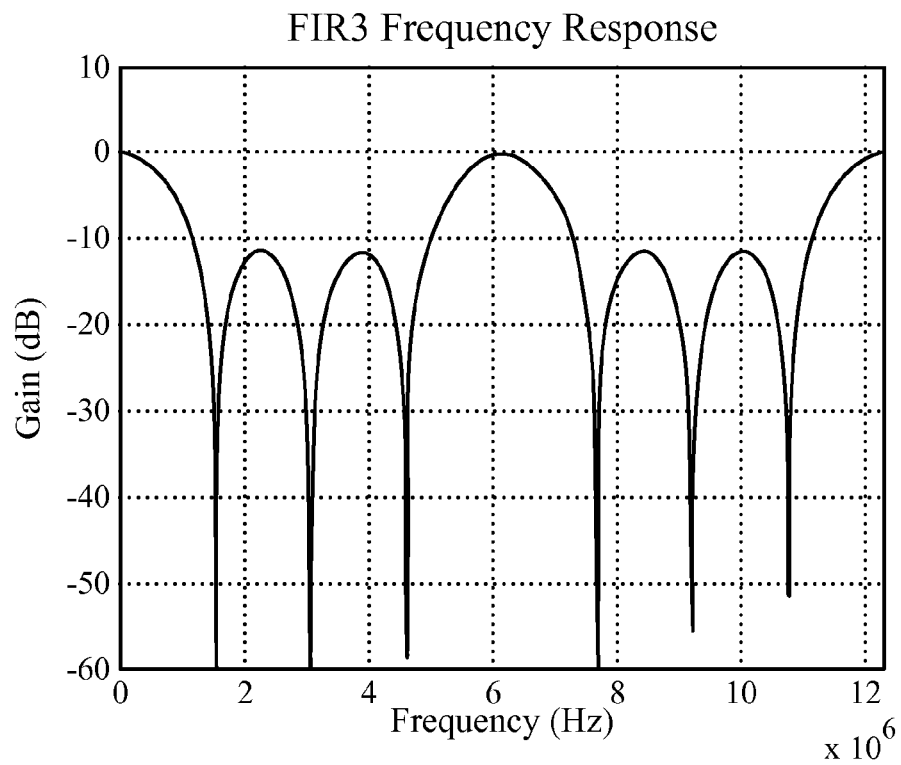
FIG. 12 is the FIR filter response of a FIR3 type programmable digital filter.

FIG. 12 is the FIR filter response of a FIR3 type programmable digital filter.

Figure 13:
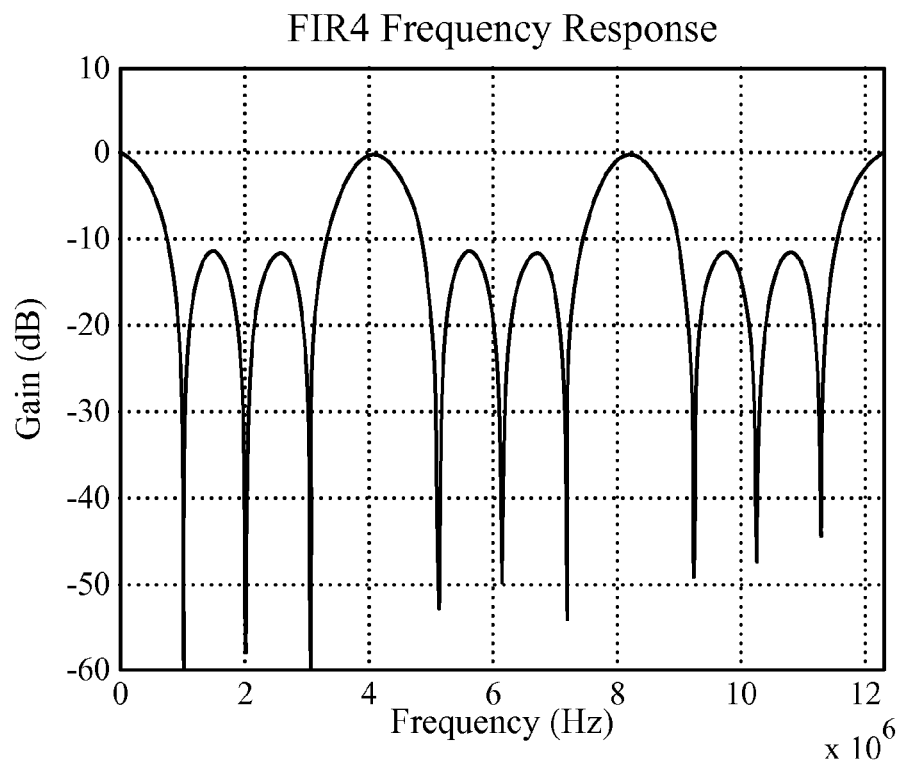
FIG. 13 is the FIR filter response of a FIR4 type programmable digital filter.

FIG. 13 is the FIR filter response of a FIR4 type programmable digital filter.

Those of skill in the art would understand that signals may be represented using any of a variety of different techniques. For example, data, instructions, signals that may be referenced throughout the above description may be represented by voltages, currents, electromagnetic waves, magnetic fields or particles, or any combination thereof.

Those of skill would further appreciate that the various illustrative radio frequency or analog circuit blocks described in connection with the disclosure herein may be implemented in a variety of different circuit topologies, on one or more integrated circuits, separate from or in combination with logic circuits and systems while performing the same functions described in the present disclosure.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor may read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but are to be accorded the widest scope consistent with the principles and novel features disclosed herein.

What is claimed is:

1. A method of operating a power amplifier operable at a selected switching rate setting and a programmable digital filter operable at a selected frequency response setting, comprising:
   identifying a current bandwidth of an incoming audio signal; and
   adaptively selecting a switching rate setting and a frequency response setting based on the current bandwidth.

2. The method of claim 1, wherein the frequency response setting is selected so as to reduce noise fold over in the power amplifier for a corresponding bandwidth, sampling rate setting, and switching frequency setting.

3. The method of claim 1, wherein the power amplifier is a class D amplifier.

4. The method of claim 1, wherein the programmable digital filter is a configurable FIR filter.

5. The method of claim 1, wherein the programmable digital filter and the power amplifier are in a single integrated circuit (IC).

6. The method of claim 1, wherein the adaptively selecting further includes selecting a sampling rate setting.

7. The method of claim 1, wherein the adaptively selecting further includes configuring for single-ended or differential system signals.

8. A processor device for operating a power amplifier operable at a selected switching rate setting and a programmable digital filter operable at a selected frequency response setting, comprising:
   means for identifying a selected bandwidth of an incoming audio signal; and
   means for adaptively selecting a switching rate setting and a frequency response setting based on the bandwidth.

9. The processor device of claim 1, wherein the frequency response setting is selected so as to reduce noise fold over in the power amplifier for a corresponding bandwidth, sampling rate setting, and switching frequency setting.

10. The processor device of claim 7, wherein the power amplifier is a class D amplifier.

11. The processor device of claim 7, wherein the programmable digital filter is a configurable FIR filter.

12. The processor device of claim 7, wherein the processor device is an IC.

13. The processor device of claim 7, wherein the power amplifier and the programmable digital filter are in a single IC.

14. The processor device of claim 7, wherein the processor device configures for single-end or differential system signals.

15. A programmable amplifier system having a programmable digital filter and a power amplifier, responsive to a plurality of frequency response settings and switching frequency settings, respectively, each frequency response setting and switching frequency setting being adaptively selected by a processor device to match a bandwidth of an incoming audio signal.

16. The programmable amplifier system of claim 13, wherein the frequency response setting is selected so as to reduce noise fold over in the power amplifier for a corresponding bandwidth, sampling rate setting, and switching frequency setting.

17. The programmable amplifier system of claim 13, wherein the power amplifier is a class D amplifier.

18. The programmable amplifier system of claim 13, wherein the programmable digital filter is a configurable FIR filter.

19. The programmable amplifier system of claim 13, wherein the programmable amplifier system is an IC.

20. The programmable amplifier system of claim 13, further comprising a low pass filter for filtering high frequency noise components into the power amplifier.

21. The programmable amplifier system of claim 13, wherein the programmable amplifier system further includes configuring for single-ended or differential system signals.

22. A computer program product for storing instructions, for use in a processor device configured to operate a power amplifier operable at a selected switching rate setting and a programmable digital filter operable at a selected frequency response setting, to cause the processor device to:
identify a selected bandwidth of an incoming audio signal; and
adaptively select a switching rate setting and a frequency response setting based on the bandwidth.

23. The computer program product of claim 19, wherein the frequency response setting is selected so as to reduce noise fold over in the power amplifier for a corresponding bandwidth, sampling rate setting, and switching frequency setting.

* * * * *